United States Patent
Nania et al.

(10) Patent No.: US 10,193,494 B2
(45) Date of Patent: Jan. 29, 2019

(54) VEHICLE GLASS ROOF SYSTEMS

(71) Applicant: FORD GLOBAL TECHNOLOGIES, LLC, Dearborn, MI (US)

(72) Inventors: Adrian Nania, Rochester, MI (US); Jacob Mathews, Canton, MI (US); Daniel Boston, Dearborn, MI (US)

(73) Assignee: FORD GLOBAL TECHNOLOGIES, LLC, Dearborn, MI (US)

(*) Notice: Subject to any disclaimer, the term of this patent is extended or adjusted under 35 U.S.C. 154(b) by 0 days.

(21) Appl. No.: 15/606,319

(22) Filed: May 26, 2017

(65) Prior Publication Data
US 2018/0342977 A1    Nov. 29, 2018

(51) Int. Cl.
| | |
|---|---|
| H02S 40/22 | (2014.01) |
| B62D 65/06 | (2006.01) |
| H01L 31/054 | (2014.01) |
| H02S 40/40 | (2014.01) |
| B62D 65/00 | (2006.01) |
| B62D 65/04 | (2006.01) |
| B62D 25/06 | (2006.01) |
| B60R 13/02 | (2006.01) |
| H01L 31/052 | (2014.01) |
| G02F 1/01 | (2006.01) |

(52) U.S. Cl.
CPC .......... *H02S 40/22* (2014.12); *B60R 13/0231* (2013.01); *B62D 25/06* (2013.01); *B62D 65/005* (2013.01); *B62D 65/04* (2013.01); *B62D 65/06* (2013.01); *H01L 31/052* (2013.01); *H01L 31/054* (2014.12); *H02S 40/40* (2014.12); *B32B 2274/00* (2013.01); *G02F 2001/0113* (2013.01)

(58) Field of Classification Search
CPC .............................. H02S 40/22; H01L 31/054
USPC .................................. 296/211, 215; 359/241
See application file for complete search history.

(56) References Cited

U.S. PATENT DOCUMENTS

| | | | | |
|---|---|---|---|---|
| 5,213,626 A | * | 5/1993 | Paetz ................ | B32B 17/10036 136/244 |
| 6,001,487 A | * | 12/1999 | Ladang ............. | B32B 17/10045 428/344 |
| 6,039,390 A | * | 3/2000 | Agrawal ........... | B32B 17/10036 296/211 |
| 9,235,099 B2 | | 1/2016 | Lam et al. | |
| 2013/0076057 A1 | * | 3/2013 | Hagen .................... | B60J 3/0286 296/96.14 |
| 2015/0165965 A1 | | 6/2015 | Masaki et al. | |
| 2015/0239342 A1 | * | 8/2015 | Kimura .................. | B60K 16/00 296/215 |
| 2017/0323990 A1 | * | 11/2017 | Yu ......................... | H01L 31/054 |

FOREIGN PATENT DOCUMENTS

| | | | |
|---|---|---|---|
| CA | 2833843 | | 5/2014 |
| CN | 204701430 U | | 10/2015 |
| CN | 205836488 U | | 12/2016 |
| DE | 2011015948 | * | 10/2012 |
| KR | 100550608 B1 | | 2/2006 |
| KR | 20140132025 A | | 11/2014 |

\* cited by examiner

*Primary Examiner* — Dennis H Pedder
(74) *Attorney, Agent, or Firm* — Carlson, Gaskey & Olds

(57) ABSTRACT

A glass roof system includes a first glass layer, a photovoltaic module, a switching film powered by the photovoltaic module, and a control module configured to selectively control the switching film based on a passenger cabin temperature.

23 Claims, 4 Drawing Sheets

VEHICLE GLASS ROOF SYSTEMS

TECHNICAL FIELD

This disclosure relates to vehicle glass roof systems that utilize self-powered switching films for controlling light transmission into a passenger cabin of the vehicle.

BACKGROUND

Many vehicles include glass roof systems for increasing the brightness of a passenger compartment of the vehicle. Known glass roof systems have limited capabilities. For example, a typical glass roof system either allows light to enter the passenger cabin when uncovered by a powered or manual roller shade or blocks light from entering the passenger cabin when covered by the roller shade.

SUMMARY

A glass roof system according to an exemplary aspect of the present disclosure includes, among other things, a first glass layer, a photovoltaic module, a switching film powered by the photovoltaic module, and a control module configured to selectively control the switching film based on a passenger cabin temperature.

In a further non-limiting embodiment of the foregoing glass roof system, the photovoltaic module includes a plurality of solar cells.

In a further non-limiting embodiment of either of the foregoing glass roof systems, the switching film is positioned axially between a first solar cell and a second solar cell of the photovoltaic module.

In a further non-limiting embodiment of any of the foregoing glass roof systems, the photovoltaic module is positioned between the first glass layer and the switching film.

In a further non-limiting embodiment of any of the foregoing glass roof systems, a second glass layer is on an opposite side of the switching film from the first glass layer.

In a further non-limiting embodiment of any of the foregoing glass roof systems, the switching film is positioned between the photovoltaic module and a second glass layer.

In a further non-limiting embodiment of any of the foregoing glass roof systems, portions of the switching film and a thermoplastic layer are disposed axially between a first solar cell and a second solar cell of the photovoltaic module.

In a further non-limiting embodiment of any of the foregoing glass roof systems, a thermoplastic layer is disposed between the first glass layer and the photovoltaic module.

In a further non-limiting embodiment of any of the foregoing glass roof systems, the thermoplastic layer is a polyvinyl butyral film.

In a further non-limiting embodiment of any of the foregoing glass roof systems, the control module is configured to control a voltage applied to the switching film from the photovoltaic module based on the passenger cabin temperature.

In a further non-limiting embodiment of any of the foregoing glass roof systems, a sensor system is configured to monitor the passenger cabin temperature.

In a further non-limiting embodiment of any of the foregoing glass roof systems, the control module is configured to lighten or darken the switching film to control the brightness of the passenger cabin.

A method according to another exemplary aspect of the present disclosure includes, among other things, controlling a switching film of a glass roof system of a vehicle based on a passenger cabin temperature of the vehicle.

In a further non-limiting embodiment of the foregoing methods, controlling the switching film includes darkening the switching film if the passenger cabin temperature exceeds a first predefined temperature threshold.

In a further non-limiting embodiment of either of the foregoing methods, darkening the switching film reduces the brightness of the passenger cabin.

In a further non-limiting embodiment of any of the foregoing methods, controlling the switching film includes lightening the switching film if the passenger cabin temperature is below a second predefined temperature threshold.

In a further non-limiting embodiment of any of the foregoing methods, lightening the switching film increases the brightness of the passenger cabin.

In a further non-limiting embodiment of any of the foregoing methods, controlling the switching film includes modifying an amount of light permitted to pass through the glass roof system.

In a further non-limiting embodiment of any of the foregoing methods, modifying the amount of light includes darkening the switching film or lightening the switching film.

A vehicle according to another exemplary aspect of the present disclosure includes, among other things, a passenger cabin and a glass roof system for controlling light transmission into the passenger cabin. The glass roof system includes a glass layer, a photovoltaic module, a switching film selectively powered by the photovoltaic module, and a control system configured to selectively darken or lighten the switchable film based on a temperature of the passenger cabin.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure details vehicle glass roof systems. An exemplary glass roof system includes a glass layer, a photovoltaic module, a switchable film powered by the photovoltaic module, and a control module configured to selectively control the switchable film to either lighten or darken the appearance of the glass roof system. The switchable film may be controlled based on a passenger cabin temperature of the vehicle. For example, a portion of the glass roof system may be darkened if the passenger cabin temperature exceeds a predefined temperature threshold or may be lightened if the passenger cabin temperature is below another predefined temperature threshold. These and other features of this disclosure are described in greater detail below.

Figure 1:
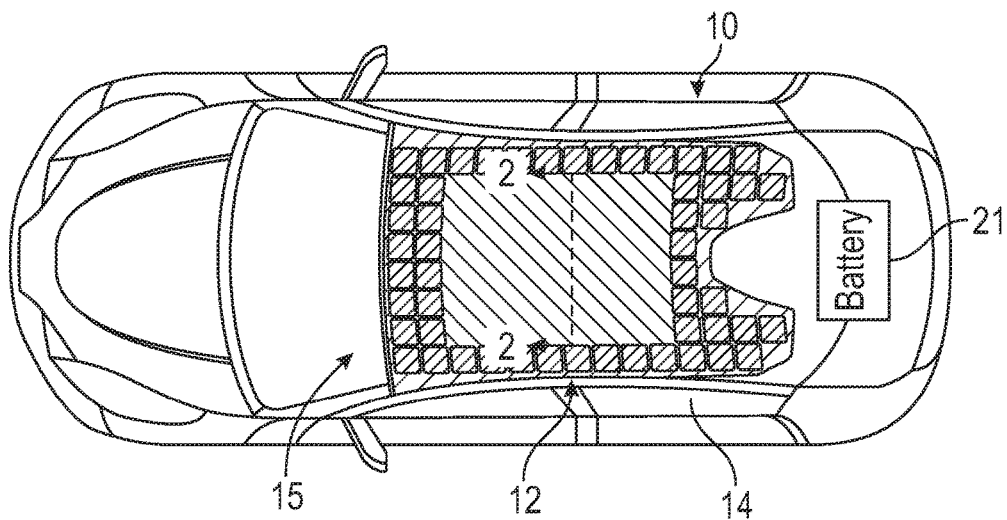
FIG. 1 illustrates a vehicle equipped with a glass roof system.

FIG. 1 schematically illustrates a vehicle 10. The vehicle 10 may be a car, a truck, a van, a sport utility vehicle, or any other type of vehicle. The vehicle 10 could also be a conventional engine powered motor vehicle or a battery powered hybrid or electric vehicle.

Although a specific component relationship is illustrated in the figures of this disclosure, the illustrations are not intended to limit this disclosure. In other words, the placement and orientation of the various components of the vehicle 10 are shown schematically and could vary within the scope of this disclosure. In addition, the various figures accompanying this disclosure are not necessarily to scale, and some features may be exaggerated or minimized to show certain details of a particular component.

The vehicle 10 includes a glass roof system 12. In an embodiment, the glass roof system 12 is mounted to a roof component 14 of the vehicle 10. However, glass roof system 12 could be mounted or attached to any portion of the vehicle 10. As discussed in greater detail below, portions of the glass roof system 12 can be controlled to either increase or decrease the amount of light permitted to pass through the glass roof system 12 into a passenger cabin 15 of the vehicle 10.

Figure 2:
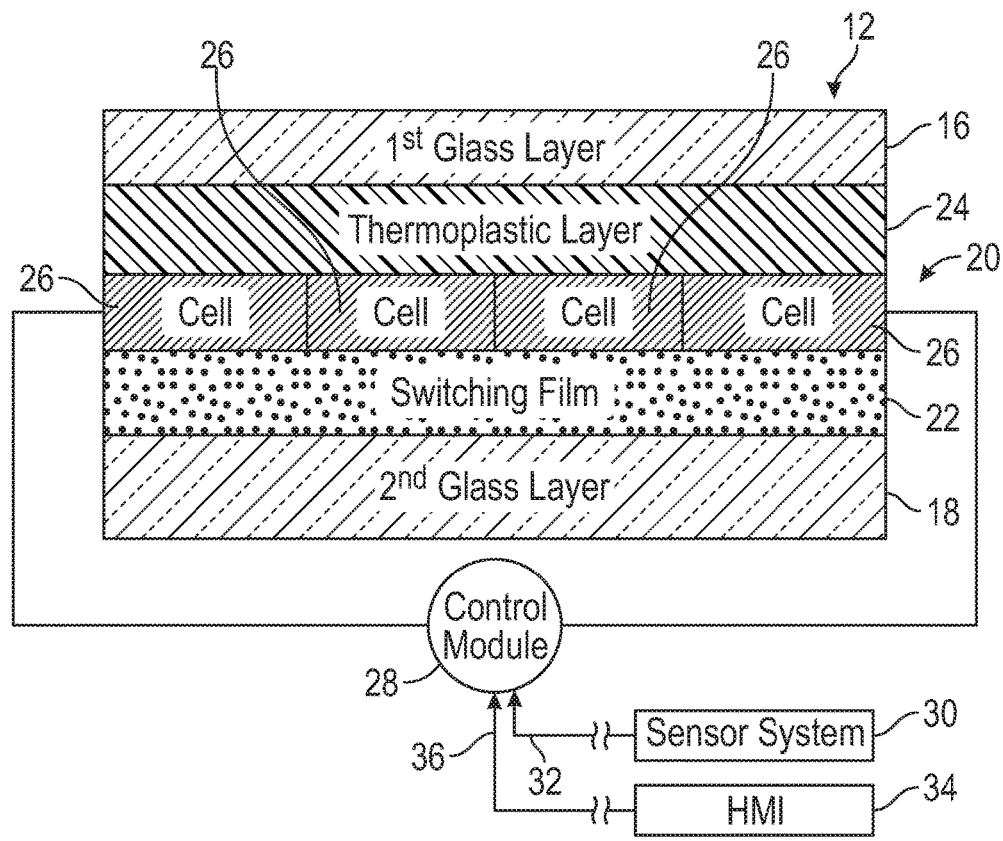
FIG. 2 is a sectional view through a portion of the glass roof system of FIG. 1.

Referring now to FIGS. 1 and 2, the glass roof system 12 is a multi-layered, fixed roof system that can automatically control the amount of light that is transmitted into the passenger cabin 15. The thickness of each layer of the glass roof system 12 shown in FIG. 2 has been exaggerated to better illustrate the various aspects of the glass roof system 12. The actual thickness of each layer is not intended to limit this disclosure, and the various thicknesses could vary from vehicle-to-vehicle to accommodate different vehicle design criteria.

In an embodiment, the glass roof system 12 includes a first glass layer 16, a second glass layer 18, a photovoltaic module 20, a switching film 22, and a thermoplastic layer 24. The first glass layer 16 and the second glass layer 18 are laminated glass sheets that permit the transmission of light into the passenger cabin 15. In an embodiment, the first glass layer 16 is clear, and the second glass layer 18 is tinted. The second glass layer 18 may be tinted any color, such as green or gray, for example.

The photovoltaic module 20, the switching film 22, and the thermoplastic layer 24 may each be sandwiched between the first glass layer 16 and the second glass layer 18. In an embodiment, the switching film 22 is sandwiched between the photovoltaic module 20 and the second glass layer 18, and the thermoplastic layer 24 is sandwiched between the photovoltaic module 20 and the first glass layer 16. Accordingly, in this embodiment, the switching film 22 and the thermoplastic layer 24 are positioned on opposite sides of the photovoltaic module 20. However, other configurations are also contemplated (see, for example, the glass roof systems of FIGS. 5 and 6).

The photovoltaic module 20, which may also be referred to as a solar panel or solar array, may capture and utilize solar energy from the sun. For example, the photovoltaic module 20 may utilize the photovoltaic affect to absorb photons of light that can be captured to create an electric current. The electric current can be used to power various vehicle loads, such as for charging a battery 21, etc. The battery 21 may be mounted anywhere on the vehicle 10 and could be either a high voltage traction battery or a low voltage battery (e.g., a 12V battery).

The photovoltaic module 20 may include a plurality of solar cells 26. The solar cells 26 may be arranged axially adjacent to one another. The specific number of solar cells 26 of the photovoltaic module 20 may vary and is not intended to limit this disclosure. In addition, the solar cells 26 may be monocrystalline silicon solar cells, thin film solar cells, multi-junction solar cells, or any other type of solar cells.

In an embodiment, a first portion of the solar cells 26 of the photovoltaic module 20 are disposed between the first and second glass layers 16, 18 of the glass roof system 12 (see, e.g., FIG. 2), and a second portion of the solar cells 26 are located around a perimeter of the first and second glass layers 16, 18 (see, e.g., FIG. 1). For example, the second portion of the solar cells 26 of the photovoltaic module 20 could be positioned in a frit or blackout area of the glass roof system 12.

Figure 3A:
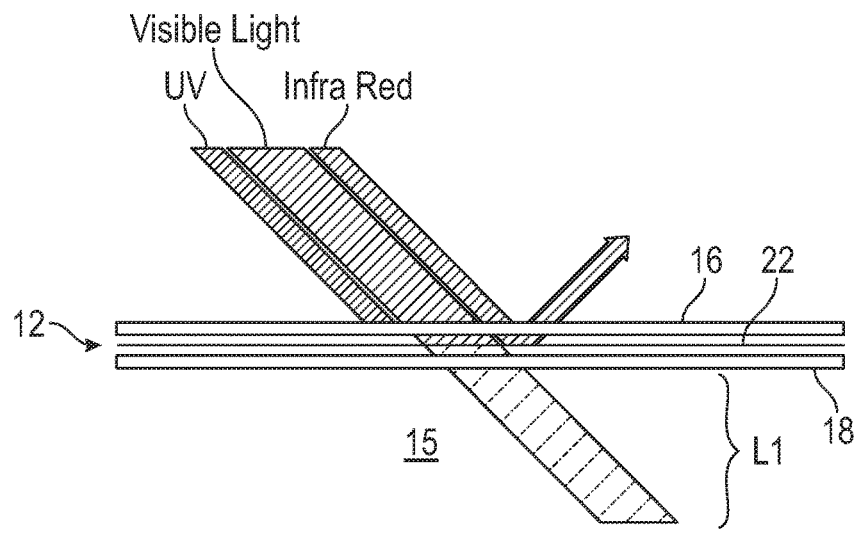
FIGS. 3A and 3B schematically illustrate different operating states of the glass roof system of FIGS. 1 and 2.
Figure 3B:
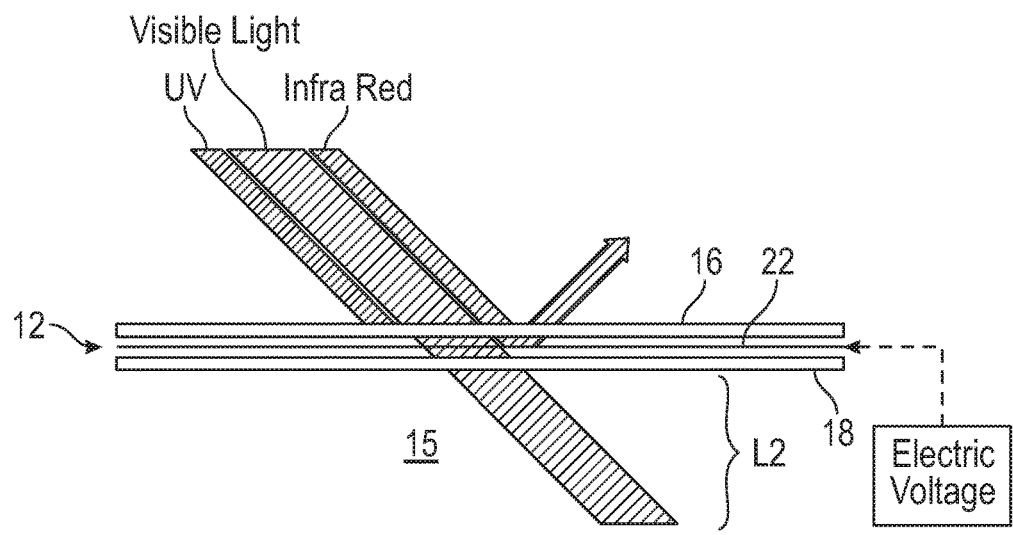

The switching film 22 may be energized, powered, or otherwise actuated to alter the amount of light permitted to enter the vehicle 10 through the glass roof system 12. For example, the switching film 22 may automatically darken when exposed to UV light or sunlight, thus allowing a reduced amount of light L1 to enter the passenger cabin 15 (see, e.g., FIG. 3A). Alternatively, when an electric voltage is applied to the switching film 22 when it is in a dark state, the switching film 22 may automatically lighten, thus allowing an increased amount of light L2 to enter the passenger cabin 15 (see, e.g., FIG. 3B).

In an embodiment, the electric charge for energizing the switching film 22 is sourced from the photovoltaic module 20. The glass roof system 12 is therefore considered to be self-powered. When the voltage from the photovoltaic module 20 is applied to the switching film 22, the switching film will lighten or become clearer. The switching film may utilize any switchable glazing technology, including but not limited to suspended particle device (SPD) technology, polymer dispersed liquid crystal (PDLC) technology, etc.

In another embodiment, the switching film 22 is a polymer film. In an embodiment, the switching film 22 is a photo-electrochromic material film. Other polymer films, such as SPD films, PDLC films, photochromic films, electrochromic films, or polarized films, could also be utilized as the switching film 22 within the scope of this disclosure.

The thermoplastic layer 24 may provide structural integrity for supporting the switching film 22 and/or other layers of the glass roof system 12. The thermoplastic layer 24 may be transparent to allow the transmission of light therethrough. In an embodiment, the thermoplastic layer 24 is a polyvinyl butyral (PVB) layer. In another embodiment, the thermoplastic layer 24 is an ethylene-vinyl acetate (EVA) layer. However, other thermoplastic materials could also be utilized within the scope of this disclosure.

The glass roof system 12 may additionally include a control module 28. The control module 28 may be part of an overall vehicle control unit, such as a vehicle system controller (VSC), or could alternatively be a standalone control unit separate from the VSC. The control module 28 may be equipped with executable instructions for interfacing with and commanding operation of various components of the glass roof system 12, including but not limited to the switching film 22 and the photovoltaic module 20. The control module 28 may include a processing unit and non-transitory memory for executing the various control strategies or modes of the glass roof system 12.

The processing unit, in an embodiment, is configured to execute one or more programs stored in the memory of the control module 28. A first exemplary program, when executed, may determine when to energize the switching film 22, such as by commanding a voltage to be applied from the photovoltaic module 20 to lighten the appearance of the glass roof system 12. A second exemplary program, when executed, may determine the amount of voltage to apply to the switching film 22 to achieve a desired amount of light transmission into the passenger cabin 15.

In an embodiment, the switching film 22 may be lightened or darkened by the altering the voltage applied to it based on a temperature of the passenger cabin 15. For example, the temperature of the passenger cabin 15 may be monitored by a sensor system 30. The sensor system 30, which includes various vehicle sensors for monitoring the temperature of the passenger cabin 15, may periodically communicate temperature information 32 to the control module 28. Based on the temperature information 32, the control module 28 may be programmed to determinate whether the switching film 22 should be lightened to allow more light into the passenger cabin 15, darkened to allow less light in the passenger cabin 15, or neither.

In another embodiment, the switching film 22 may be lightened or darkened by the altering the voltage applied to it based on a direct user command. For example, a driver or other passenger of the vehicle 10 may select a desired level of light transmission through the glass roof system 12 using a human machine interface (HMI) 34 located within the passenger cabin 15 of the vehicle 10. The HMI 34 communicates a command signal 36 to the control module 28 in response to the user selecting the desired level of light transmission. Based on the command signal 36, the control module 28 may be programmed to determinate whether the switching film 22 should be lightened to allow more light into the passenger cabin 15, darkened to allow less light in the passenger cabin 15, or neither.

Figure 4:
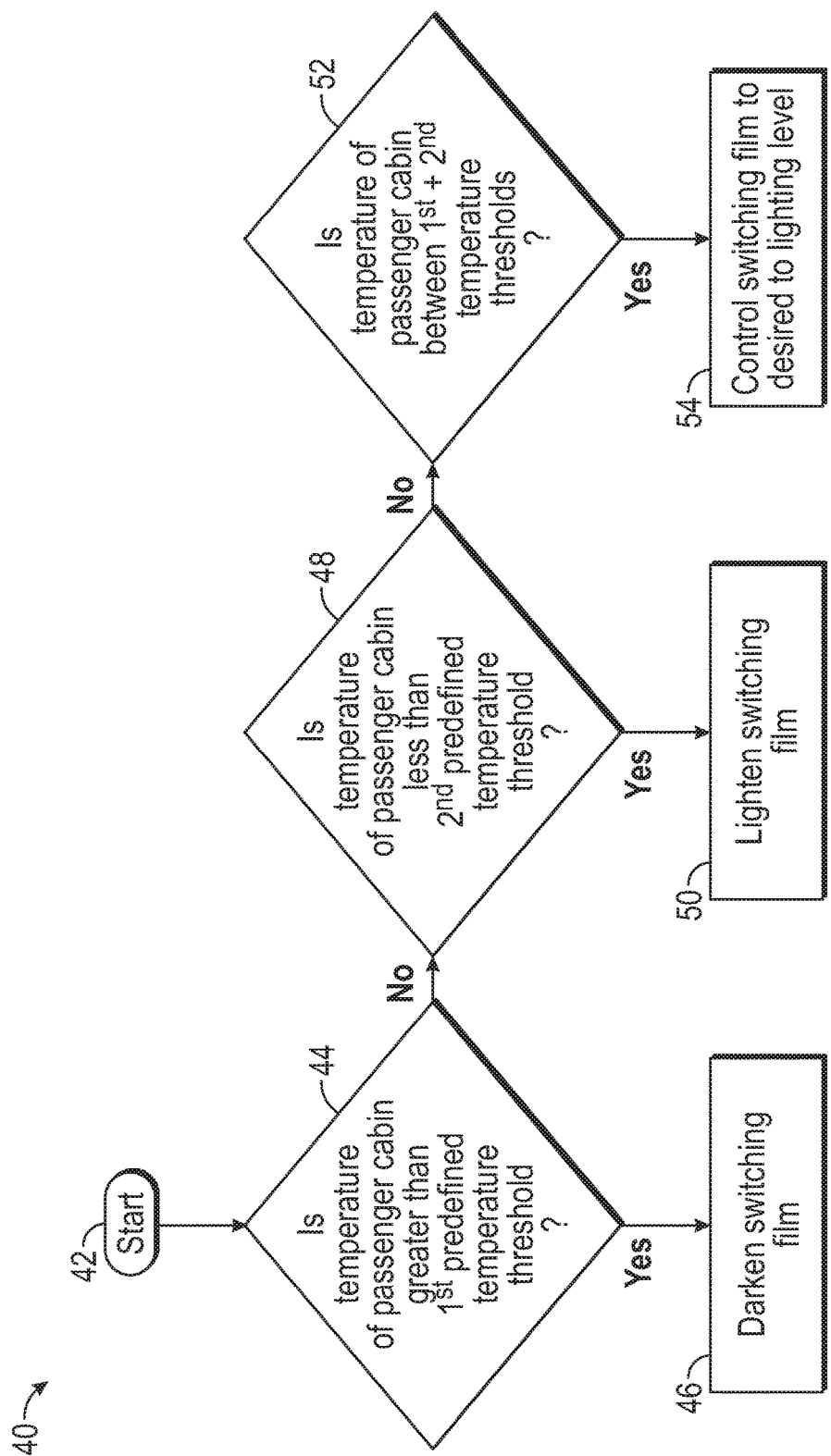
FIG. 4 schematically illustrates a method for controlling a glass roof system of a vehicle.

FIG. 4, with continued reference to FIGS. 1 through 3B, schematically illustrates an exemplary control strategy 40 for controlling the glass roof system 12 of the vehicle 10 to alter an amount of light permitted to enter the passenger cabin 15 through the glass roof system 12. In an embodiment, the control module 28 of the glass roof system 12 is programmed with one or more algorithms adapted to execute the exemplary control strategy 40.

The exemplary control strategy 40 begins at block 42. At block 44, the control strategy 40 determines whether the temperature of the passenger cabin 15 of the vehicle 10 exceeds a first predefined temperature threshold. The control module 28 of the glass roof system 12 may monitor the temperature information 32 received from the sensor system 30 to determine whether or not the temperature has exceeded the first predefined temperature threshold. The first predefined temperature threshold is design specific and therefore can be programmed at any temperature.

If the temperature of the passenger cabin 15 exceeds the first predefined temperature threshold, the control strategy 40 proceeds to block 46 by automatically darkening the switching film 22. In an embodiment, the switching film 22 may be darkened by reducing the voltage that is applied to the switching film 22 by the photovoltaic module 20. In another embodiment, the control module 28 may command a specific darkness level by referencing a first look-up table stored in its memory.

Alternatively, if the temperature of the passenger cabin 15 does not exceed the predefined temperature threshold, the control strategy 40 proceeds to block 48. At this step, the control module 28 may determine whether the temperature of the passenger cabin 15 is less than a second predefined temperature threshold. The second predefined temperature threshold is also design specific and therefore can be programmed at any temperature. If YES, the switching film 22 is automatically lightened at block 50 by increasing the voltage that is applied to the switching film 22 by the photovoltaic module 20. The control module 28 may command a specific lighting level by referencing a second look-up table, for example.

The control strategy 40 may proceed to block 52 if the temperature of the passenger cabin 15 is determined to be between the first predefined temperature threshold and the second predefined temperature threshold. If YES, the control strategy 40 proceeds to block 54 by controlling the switching film 22 to a desired lighting level. This may include either darkening the switching film 22, lightening the switching film 22, or neither. The control module 28 may determine whether to darken, lighten, or maintain the switching film 22 at its current setting based on the actual temperature of the passenger cabin 15. In another embodiment, the control module 28 may command a specific lighting level by referencing a third look-up table.

Figure 5:
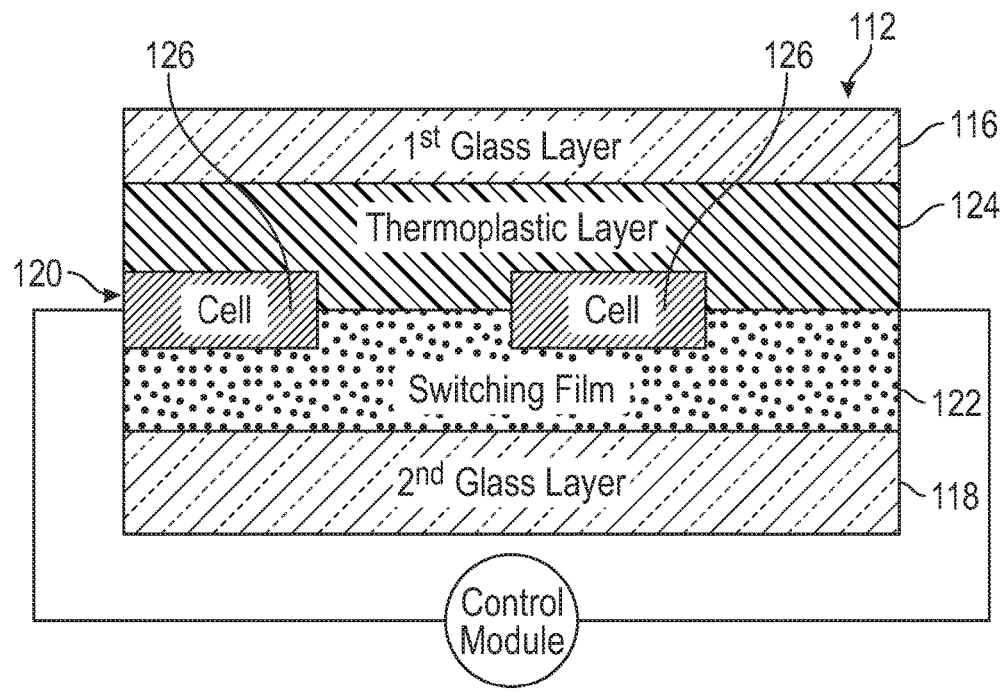
FIG. 5 illustrates another exemplary glass roof system for a vehicle.

FIG. 5 is a cross-section of another glass roof system 112. The glass roof system 112 functions similar to the glass roof system 12 described above but includes a slightly modified layering arrangement. In this embodiment, for example, the glass roof system 112 includes a first glass layer 116, a second glass layer 118, a photovoltaic module 120, a switching film 122, and a thermoplastic layer 124. The photovoltaic module 120, the switching film 122, and the thermoplastic layer 124 may each be sandwiched between the first glass layer 116 and the second glass layer 118. In an embodiment, the switching film 122 is sandwiched between the photovoltaic module 120 and the second glass layer 118, and the thermoplastic layer 124 is sandwiched between the photovoltaic module 120 and the first glass layer 116.

The photovoltaic module 120 may include a plurality of spaced part solar cells 126 such that, together with the switching film 122 and the thermoplastic layer 124, the solar cells 126 establish a "checkered pattern." Portions of the switching film 122 and the thermoplastic layer 124 extend axially between the adjacent solar cells 126 to space the solar cells 126 apart from one another and thus establish the "checkered" pattern.

Figure 6:
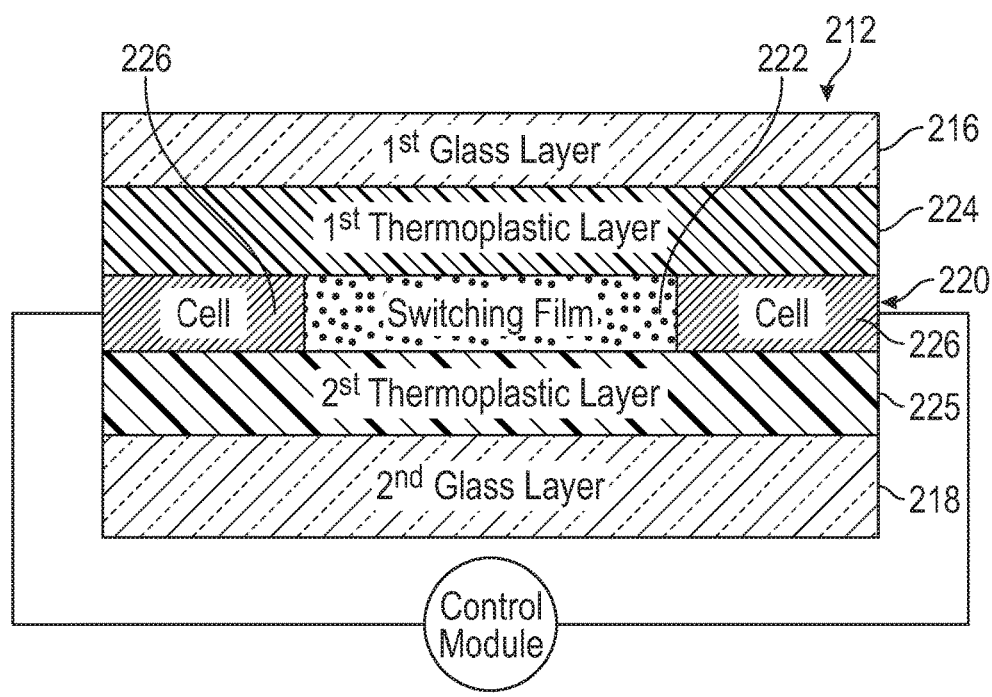
FIG. 6 illustrates yet another exemplary glass roof system for a vehicle.

FIG. 6 is a cross-section of yet another glass roof system 212. The glass roof system 212 functions similar to the glass roof systems 12, 112 described above but includes another slightly modified layering arrangement. In this embodiment, for example, the glass roof system 212 includes a first glass layer 216, a second glass layer 218, a photovoltaic module 220, a switching film 222, a first thermoplastic layer 224, and a second thermoplastic layer 225. The switching film 222 may be positioned axially adjacent solar cells 226 of the photovoltaic module 220 such that the switching film 222 and the photovoltaic module 220 are interspersed to form a single layer of the glass roof system 212. The single layer established by the switching film 222 and the photovoltaic module 220 may be sandwiched between the first thermoplastic layer 224 and the second thermoplastic layer 225. Each of the first thermoplastic layer 224, the photovoltaic module 220, the switching film 222, and the second thermoplastic layer 225 may be sandwiched between the first glass layer 216 and the second glass layer 218 in this exemplary construction.

The glass roof systems of this disclosure provide increased usability within vehicles. By self-powering the glass roof systems using photovoltaic modules, the use of relatively expensive and complex roller shades can be avoided, thus reducing costs, reducing weight, and improving fuel economy. In addition, the self-powered glass roof systems of this disclosure reduce the need to use power from the vehicle's on-board batteries, thus preserving this stored energy for various other vehicle uses.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A glass roof system, comprising:
   a first glass layer;
   a second glass layer;
   a photovoltaic module;
   a switching film powered by the photovoltaic module, wherein the switching film is positioned between the first glass layer and the second glass layer and is positioned axially between a first solar cell and a second solar cell of the photovoltaic module; and
   a control module configured to selectively control the switching film based on a passenger cabin temperature.

2. The glass roof system as recited in claim 1, wherein the photovoltaic module includes a plurality of solar cells.

3. The glass roof system as recited in claim 1, wherein the photovoltaic module is positioned between the first glass layer and the switching film.

4. The glass roof system as recited in claim 1, wherein the switching film is positioned between the photovoltaic module and the second glass layer.

5. The glass roof system as recited in claim 1, wherein portions of said switching film and a thermoplastic layer are disposed axially between said first solar cell and said second solar cell of the photovoltaic module.

6. The glass roof system as recited in claim 1, comprising a thermoplastic layer disposed between the first glass layer and the photovoltaic module.

7. The glass roof system as recited in claim 6, wherein the thermoplastic layer is a polyvinyl butyral film.

8. The glass roof system as recited in claim 1, wherein the control module is configured to control a voltage applied to the switching film from the photovoltaic module based on the passenger cabin temperature.

9. The glass roof system as recited in claim 1, comprising a sensor system configured to monitor the passenger cabin temperature.

10. The glass roof system as recited in claim 1, wherein the control module is configured to lighten or darken the switching film to control the brightness of the passenger cabin.

11. A method, comprising:
    controlling a switching film of a glass roof system of a vehicle based on a passenger cabin temperature of the vehicle,
    wherein the switching film is powered by a photovoltaic module, is contiguous with at least one solar cell of the photovoltaic module, and is positioned axially between a first solar cell and a second solar cell of the photovoltaic module.

12. The method as recited in claim 11, wherein controlling the switching film includes:
    darkening the switching film if the passenger cabin temperature exceeds a first predefined temperature threshold.

13. The method as recited in claim 12, wherein darkening the switching film reduces the brightness of the passenger cabin.

14. The method as recited in claim 11, wherein controlling the switching film includes:
    lightening the switching film if the passenger cabin temperature is below a second predefined temperature threshold.

15. The method as recited in claim 14, wherein lightening the switching film increases the brightness of the passenger cabin.

16. The method as recited in claim 11, wherein controlling the switching film includes:
    modifying an amount of light permitted to pass through the glass roof system.

17. The method as recited in claim 16, wherein modifying the amount of light includes darkening the switching film or lightening the switching film.

18. A vehicle, comprising:
    a passenger cabin; and
    a glass roof system for controlling light transmission into the passenger cabin, the glass roof system including a glass layer, a photovoltaic module, a switching film selectively powered by the photovoltaic module, and a control system configured to selectively darken or lighten the switchable film based on a temperature of the passenger cabin,
    wherein the switching film is contiguous with at least one solar cell of the photovoltaic module and is positioned axially between a first solar cell and a second solar cell of the photovoltaic module.

19. The glass roof system as recited in claim 1, wherein a first plurality of solar cells of the photovoltaic module is disposed between the first and second glass layers and a second plurality of solar cells of the photovoltaic module is disposed around a perimeter of the first and second glass layers.

20. The glass roof system as recited in claim 1, wherein the switching film is sandwiched directly between the photovoltaic module and the second glass layer.

21. The glass roof system as recited in claim 1, wherein the photovoltaic module is sandwiched directly between a thermoplastic layer and the switching film.

22. The glass roof system as recited in claim 1, wherein the switching film is sandwiched directly between a thermoplastic layer and the second glass layer.

23. A glass roof system, comprising:
a first glass layer;
a second glass layer;
a photovoltaic module;
a switching film powered by the photovoltaic module, wherein the switching film is positioned between the first glass layer and the second glass layer and is contiguous with at least one solar cell of the photovoltaic module; and
a control module configured to selectively control the switching film based on a passenger cabin temperature,
wherein a first solar cell of the photovoltaic module contacts a first side of the switching film, a second solar cell of the photovoltaic module contacts a second side of the switching film, a first thermoplastic layer contacts a third side of the switching film, and a second thermoplastic layer contacts a fourth side of the switching film.

* * * * *